US006703901B2

(12) United States Patent
Jovenin et al.

(10) Patent No.: US 6,703,901 B2
(45) Date of Patent: Mar. 9, 2004

(54) FREQUENCY SYNTHESIZER AND LOW-NOISE FREQUENCY SYNTHESIZING METHOD

(75) Inventors: Fabrice Jovenin, Caen (FR); Dominique Brunel, Caen (FR); Zhizhong Wang, Caen (FR)

(73) Assignee: Koninklijke Philips Electronics N.V., Eindhoven (DE)

( * ) Notice: Subject to any disclaimer, the term of this patent is extended or adjusted under 35 U.S.C. 154(b) by 30 days.

(21) Appl. No.: 09/965,455

(22) Filed: Sep. 27, 2001

(65) Prior Publication Data
US 2002/0113658 A1 Aug. 22, 2002

(30) Foreign Application Priority Data

Sep. 29, 2000 (FR) .............................. 00 12459
Dec. 26, 2000 (FR) .............................. 00 17042

(51) Int. Cl.$^7$ ................................. H03L 7/00
(52) U.S. Cl. ........................ 331/1 A; 331/10; 331/16
(58) Field of Search ...................... 331/1 A, 51, 16, 331/25, 10, 23; 375/376, 247

(56) References Cited

U.S. PATENT DOCUMENTS 4,179,670 A  * 12/1979 Kingsbury .................. 331/10
5,038,117 A  *  8/1991 Miller ........................ 331/16
5,055,802 A  * 10/1991 Hietala et al. .............. 331/16
5,903,194 A  *  5/1999 Opsahl et al. ............. 331/1 A
6,008,703 A  * 12/1999 Perrott et al. ............. 332/100
6,047,029 A  *  4/2000 Eriksson et al. ........... 375/247
6,219,397 B1 *  4/2001 Park .......................... 375/376

FOREIGN PATENT DOCUMENTS

EP          0563400 A1    10/1992  ............ H03L/7/18
EP          0661816 B1    12/1994  ............ H03L/7/187

* cited by examiner

Primary Examiner—Michael Tokar
Assistant Examiner—John B Nguyen
(74) Attorney, Agent, or Firm—Aaron Waxler

(57) ABSTRACT

A frequency synthesizer comprising a phase-locked loop (10) and comprising:
 a frequency divider (14) having integral dividing ratios,
 a sigma-delta modulator (30) connected to the frequency divider for obtaining a resulting mean dividing ratio having a fractional component, the modulator having an input for an adjusting instruction, and
 at least a frequency divider (100) having a fixed fractional dividing ratio, and
 means (120, 40) for activating the divider having a fractional dividing ratio when the fractional component (k) of the mean dividing ratio is contained in at least a given value range, and for modifying the adjusting instruction in corresponding manner.

11 Claims, 4 Drawing Sheets

FREQUENCY SYNTHESIZER AND LOW-NOISE FREQUENCY SYNTHESIZING METHOD

FIELD OF THE INVENTION

The present invention relates to a frequency synthesizer and a method of low-noise frequency synthesis.

The invention more particularly relates to a frequency synthesizer whose output frequency can be adjusted by integral or fractional values.

Such a frequency synthesizer may be used in various types of radio circuits and, more particularly, in receiving and/or transmitting stages of these circuits. By way of example the frequency synthesizer according to the invention may be used in wireless telephony equipment such as portable telephones.

BACKGROUND OF THE INVENTION

Figure 1:
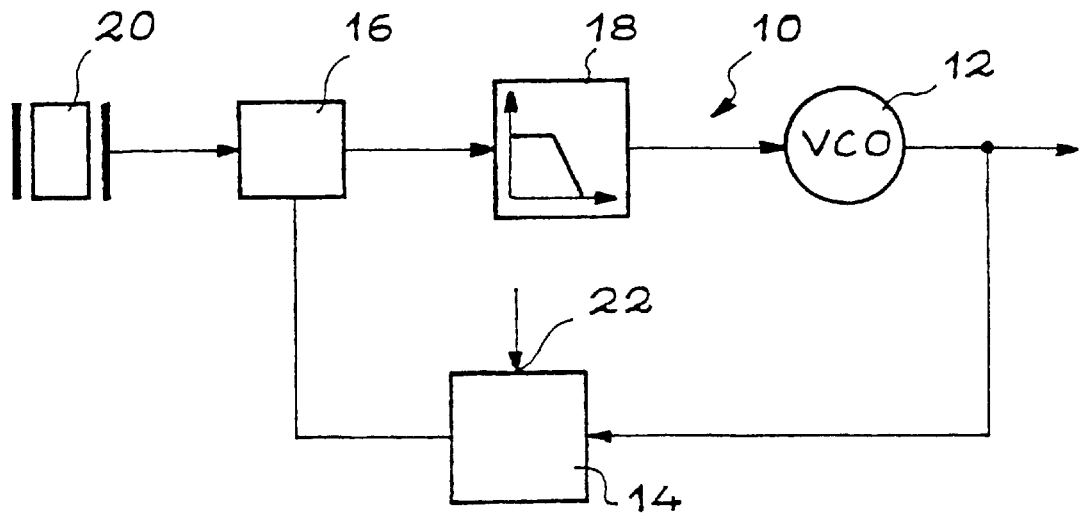
Figure 2:
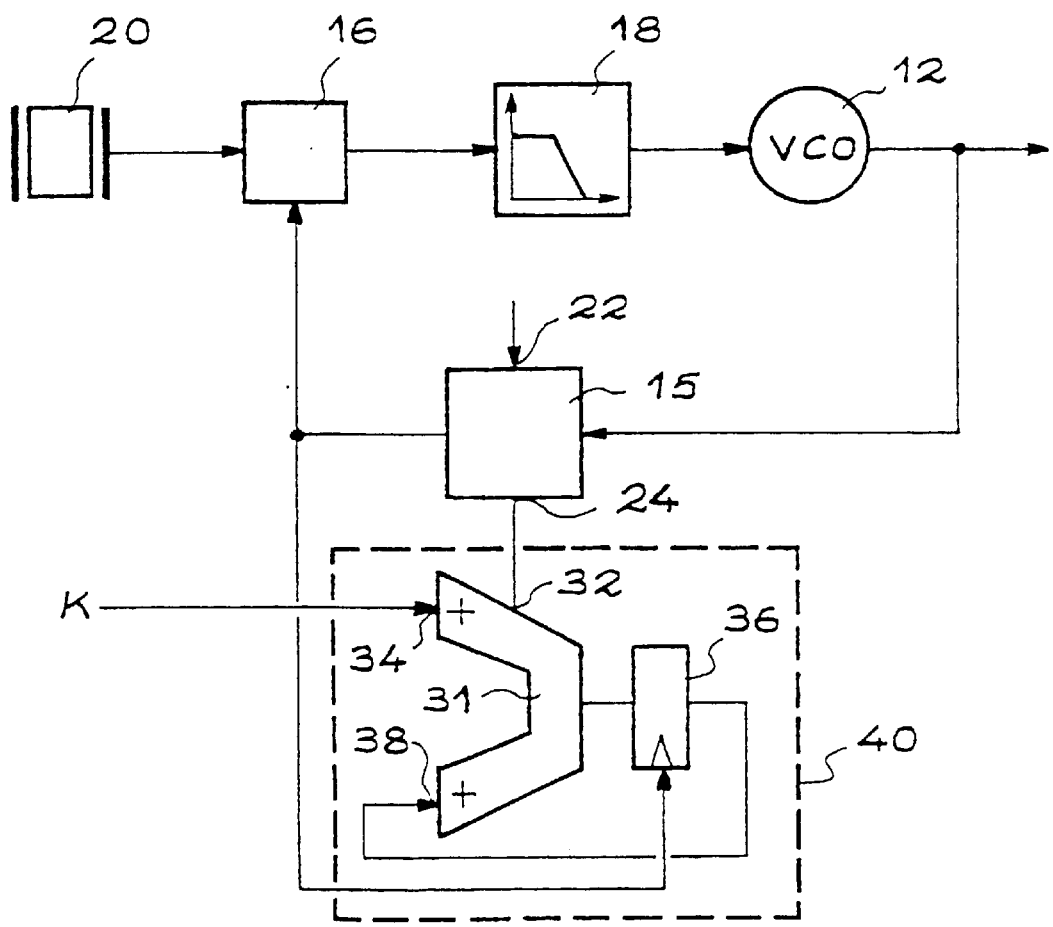

The appended FIGS. 1 and 2 illustrate an integral-value adjustable frequency synthesizer and a fractional-value adjustable frequency synthesizer. A fractional-value adjustable frequency synthesizer is understood to be a frequency synthesizer whose frequency can be adjusted by integral or non-integral multiples of a reference frequency. Such devices are known per se and illustrated, for example, by the documents (1), (2) and (3), whose complete references are stated at the end of the description.

FIG. 1 indicates the basic structure of a frequency synthesizer, which is constructed around a phase-locked loop 10. The phase-locked loop comprises, in essence, a voltage-controlled oscillator 12, a frequency divider 14, a phase-frequency comparator 16 and a loop filter 18.

The voltage-controlled oscillator 12, also referred to as <<VCO oscillator>> in the following of the text, delivers an output signal whose frequency cannot be increased or reduced as a function of a control voltage applied to its input. This control voltage is produced by the phase-frequency comparator 16, which is connected to the input of the VCO oscillator 12 via the loop filter 18.

The phase-frequency comparator 16 compares the frequency (or phase) of a signal delivered by the frequency divider 14 and the frequency of a reference signal delivered in the example of the Figure by a quartz device 20. When the frequency of the signal delivered by the frequency divider is lower than that of the reference signal, the phase-frequency comparator produces with the loop filter 18 a voltage instructing the frequency of the VCO oscillator 12 to be increased. Conversely, the frequency of the VCO oscillator is reduced when the frequency of the signal delivered by the frequency divider is higher than that of the reference signal.

The frequency divider 14 is a device constructed around a certain number of flip-flops and can thus divide the frequency of the signal of the VCO oscillator 12 only by integral values. The dividing ratio, which is adjustable by integral values, is an integer referred to as N. An adjusting input, indicated by an arrow 22, enables to fix the value N.

The frequency of the VCO oscillator, referred to as $F_{VCO}$ is thus such that:

$F_{VCO} = N * F_{ref}$, where $F_{REF}$ is the frequency of the reference signal delivered by the quartz device 20.

It is observed that a modification by unity of the value of the dividing ratio N (integral) provokes a variation equal to $F_{ref}$ of the frequency of the VCO oscillator. Accordingly, it is impossible to adjust the frequency of the VCO oscillator 12 with a resolution higher than $F_{ref}$. In the case where the frequency of the reference signal is relatively high, this resolution may turn out to be insufficient.

A much finer adjustment of the frequency of the output signal of the loop 10, that is to say, of the frequency of the signal delivered by the VCO oscillator 12, may be obtained with a frequency synthesizer in accordance with FIG. 2.

The frequency synthesizer shown in FIG. 2 comprises a phase-locked loop 10 which includes the same elements as those of loop 10 of FIG. 1.

The frequency divider 14, on the other hand, has not only an adjusting input 22 for fixing the value N of the dividing ratio, but also a switch input 24 for switching the dividing ratio between two or more consecutive values around the value N. In the example of FIG. 2, the switch input 24 of the frequency divider 14 enables to switch the dividing ratio between two values, which are N and N+1.

The switch input 24 is connected to a sigma-delta modulator 30 and, to be more precise, to an overflow-carry terminal 32 of this modulator.

The sigma-delta modulator 30 which, in the example of the Figure, is a first-order digital modulator with a word adder 31, has a first digital input 34 for an adjusting instruction referred to as K. The adjusting instruction is added to a digital value delivered by a shift register 36 of the modulator. The register 36 is clocked by the output signal of the frequency divider 14, and receives the output of the word adder 31. It is connected to a second digital input 38 of the adder. When the sum of the adjusting instruction and of the output of the register 36 is lower than a digital capacity of the adder 31, the overflow-carry adopts the logic 0 value, for example. On the other hand, when the sum is higher than the capacity of the adder 31, the overflow-carry adopts the complementary logic 1 value in that case.

The frequency divider 14 is arranged for performing a frequency division with a first dividing ratio when its switch input 24 receives the first logic state and for performing a division with a second dividing ratio which is different from +/−1, when the input 24 receives the second switching state.

In the example described, the dividing ratio is N for a logic 0 state and N+1 for a logic 1 state.

Although at any instant the dividing ratio of the frequency divider is an integer, the repeated switching of the ratio between N and N+1 enables to obtain a resulting mean dividing ratio comprised between these two values, that is to say, a non-integral ratio.

In a more precise way, one has:

$$F_{VCO} = \frac{1}{T_N + T_{N+1}} [T_N * N * F_{ref} + T_{N+1} * (N+1) * F_{ref}]$$

that is, $$F_{VCO} = \left[ N + \frac{T_{N+1}}{T_N + T_{N+1}} \right] * F_{ref}$$

In these expressions, $T_N$ and $T_{N+1}$ are the periods during which the dividing ratio is equal to N and N+1, respectively.

Considering that the adjusting instruction K applied to the first input 34 of the sigma-delta modulator is coded in L bits, and that the maximum capacity of the adder is $2^L - 1$, a fractional part of the dividing ratio equal to $K/2^L$ can be defined. The fractional part $k/2^L$ is also referred to as k in the following of the text. One has:

$$Fvco = \left[N + \frac{K}{2^L}\right] * F_{ref}$$ 5

For low values of the adjusting instruction (K≅0) the output frequency is close to $F_{ref}*(N)$ and for high values of the adjusting instruction (K≅$2^L$) the output frequency is close to $F_{ref}*(N+1)$.

Accordingly, it is possible to continuously adjust the frequency of the phase-locked loop between two values fixed by the choice of the dividing ratio N applied to the adjusting input 22 of the frequency divider 14 and by the choice of the adjusting instruction K applied to the sigma-delta modulator.

The spectral analysis of the output of a frequency synthesizer using a phase-locked loop in accordance with FIG. 2 shows a distribution of noise components around a central line that corresponds to the frequency $F_{VCO}$. The noise results from the contribution of the various elements of the phase-locked loop and from the sigma-delta modulator.

As suggested by the document (3), already mentioned, it is possible to replace the sigma-delta modulator having one stage as represented in FIG. 2 by a sigma-delta modulator having various cascaded stages and, in particular, by a sigma-delta modulator having two stages. A sigma-delta modulator having two stages (of the second-order) indeed permits a better shaping of the frequency distribution of the noise by moving at least part of the noise to high frequencies. This phenomenon, accentuated by the multiplication of the stages, is referred to as "noise shaping".

The applicants, however, have given a demonstration of another noise source which results in parasitic secondary lines. These secondary lines particularly appear for certain values of the adjusting instruction K.

DESCRIPTION OF THE INVENTION

As indicated previously, for obtaining a mean dividing ratio with a fractional part, the dividing ratio of the frequency divider having integral dividing ratios is switched between two or more generally integral consecutive values. For a mean dividing ratio of N+k where k represents the fractional part and N the integral part, a switch can be made, for example, between N and N+1.

It has been established that when N+k is close to N r N+1, that is to say, when the fractional component k is close to 0 or 1, one of the values of the integral dividing ratio (N or N+1) becomes very predominant relative to the other in the set of switchings. By way of illustration, when k is close to 0, that is to say, when N+k≅N, the dividing ratio N is frequent in the switch, whereas the factor N+1 is rare.

Applicants have proved the fact that the high repetition of a same integral dividing ratio at the cost of one or various other integral dividing ratios which have been made rare, also leads to a noise that is manifested by parasitic lines in the spectral response of the frequency synthesizer.

It is notably an object of the invention to avoid noise coming from the excessive repetition of certain dividing ratios.

To accomplish this object, the invention proposes a frequency synthesizer including a phase-locked loop and comprising:

a first frequency divider having integral dividing ratios, connected between a voltage-controlled VCO oscillator and a phase frequency comparator PFD, a sigma-delta modulator connected to the first frequency divider for switching the dividing ratio of the frequency divider between a series of at least two integral values, so as to obtain a resulting mean fractional dividing ratio, while the modulator has at least an input suitable for receiving an adjusting instruction of the fractional component, and at least a second frequency divider having a fixed fractional dividing ratio, connected between the voltage-controlled VCO oscillator and the frequency divider having integral dividing ratios, and means for activating the fractional dividing ratio divider when the fractional component (k) of the mean dividing ratio is contained in at least a given value range, and for modifying the adjusting instruction of the fractional component of the sigma-delta modulator.

It should be observed here that the modification of the adjusting instruction has for its object to change the fractional component so that this component is no longer contained in the given value range. The result is a modification of the mean dividing ratio of the first frequency divider. However, the sum of the new dividing ratio and of the dividing ratio of the second divider, called global dividing ratio, is preferably maintained to be equal to the mean dividing ratio that would be obtained without changing the adjusting instruction and by letting the second frequency divider inactive.

Obtaining a certain dividing ratio is, in effect, dictated by the choice of integral dividing ratios between which the integral dividing ratio divider can switch and the choice of an adjusting instruction of the fractional component. This affects the sigma-delta modulator and imposes the more or less repetitive cycles of the switching between the integral values. This is the case in the prior art synthesizers and in the synthesizer according to the invention when the fractional dividing ratio divider has not been activated. In that case a certain dividing ratio is obtained which is the mean ratio already mentioned earlier.

By activating the fractional dividing ratio divider, the global dividing ratio obtained via the integral ratio divider and the fractional ratio divider would thus be modified a priori since an additional dividing stage influences the signal.

However, as indicated above, a suitable modification of the adjusting instruction and, possibly, of the integral dividing values between which a switch takes place, permit to keep the global dividing ratio equal to the mean dividing ratio mentioned above.

The modification of the adjusting instruction thus permits to modify the repetition cycles of the integral dividing ratios and thus to eliminate the parasitic lines in the response spectrum.

In a particular embodiment of the invention where the fractional dividing ratio is 1+ε, the given value range of the fractional component (k), for which values the fractional dividing ratio divider is activated, may include the values k so that 0<k<ε/2 and 1−ε/2<k<1 with ε so that 0<ε<1.

In a general manner it may be considered that the fractional dividing ratio frequency divider is preferably activated when the fractional component is close to 0 or 1 and deactivated in the opposite case. For example, the value ranges of the fractional components k, so that 0<k<0.25 and 0.75<k<1 may correspond to activation ranges of the fractional dividing ratio frequency divider. This corresponds, for example, to ε=0.5.

The activation of the fractional dividing ratio frequency divider permits, as indicated above, to modify the fractional component of the mean dividing ratio which is to be obtained by the integral dividing ratio frequency divider, associated to the sigma-delta modulator.

To revert to the example given earlier, when an additional division by 1.5 is made, this narrows down to adding 0.5 to the fractional component of the desired mean dividing ratio.

Thus, by supposing that 0<k<0.25, one has:

$$N+k=N+0.5+k'.$$

In this expression the new fractional component k' is such that $0.25 \leq k' \leq 0.75$.

Similarly, by supposing that 0.75<k<1, one has:

$$N+k=N-1+0.5+k'.$$

with k' so that $0.25 \leq k' \leq 0.75$.

In other words, k', the new fractional component that must be generated by the integral dividing ratio frequency divider, which is associated to the sigma-delta modulator, permits a more balanced alternation between the dividing ratios, for example N−1, N and N+1 or N−1 and N. This permits to avoid the parasitic lines.

According to a perfectioning of the invention, the synthesizer may further comprise means for setting the value of the least significant bit of the adjusting instruction applied to the sigma-delta modulator to 1.

Applicants have in effect noticed a second phenomenon according to which the regular repetition of the logic values in short patterns, for example, 110011001100 and so on leads to a small number of parasitic lines. The amplitude of these lines is then relatively high. This phenomenon takes place when the value of the adjusting instruction K is even.

When, on the other hand, the value of the adjusting instruction K is odd, the repetition of the patterns remains regular indeed, but the patterns become very long. The energy of the noise is then distributed over a large number of parasitic lines having a small amplitude which resemble a continuum. The amplitude of the individually adopted lines is, however, very low, so that they disappear in the noise of the other elements of the frequency synthesizer.

In a more precise manner, the value of the parasitic frequencies can be given by the following relationship:

$$F_{spur} = \frac{F_{ref} \cdot 2^M}{2^{(0-1)} * 2^L}$$

In this expression, $F_{spur}$ indicates the frequency with which the parasitic lines recur and M indicates the number of times it is possible to divide the number K coded in L bits by 2, and 0 indicates the order of the sigma-delta modulator.

The fact that the value of the least significant bit of the adjusting instruction is fixed to 1 narrows down to making it odd. This permits to distribute the energy of the noise over a continuum of frequencies. For each of these frequencies, taken individually, the noise amplitude is consequently very low. Outside the oscillation center frequency, no parasitic line appears in the frequency response spectrum.

In all meticulousness, the modification of the least significant bit provokes a modification of the instruction value K desired by the user and thus a modification of the oscillation frequency of the phase-locked loop. However, the error of the set value in effect applied to the sigma-delta modulator remains limited to $\frac{1}{2}^L$ and leads to an imperceptible frequency change. By way of illustration, for a coding over 24 bits (L=24), the error is $\frac{1}{2}^{24}$ (<$10^{-7}$).

The invention also relates to a frequency synthesizing method by means of a phase-locked synthesizer, comprising:

a first frequency divider, having integral dividing ratios, connected between a voltage-controlled VCO oscillator and a phase frequency comparator PFD, a sigma-delta modulator connected to the frequency divider for switching the dividing ratio of the frequency divider between a series of at least two integral values, so as to obtain a resulting mean dividing ratio having a fractional component, the modulator having an input for an adjusting instruction of the fractional component, and at least a second frequency divider having a fixed fractional dividing ratio, connected between the voltage-controlled VCO oscillator and the frequency divider having an integral dividing ratio.

In accordance with the method, said frequency divider having a fractional dividing ratio is activated when the fractional component (k) of the dividing ratio is contained in at least a given value range and in corresponding manner the adjusting instruction of the fractional component of the sigma-delta modulator is modified to obtain a global dividing ratio of the first and second dividers equal to the mean dividing ratio.

The invention also relates to a frequency converter comprising a mixer with a first input, which can be connected to a signal source which delivers a signal with a frequency to be converted. The converter further includes a signal source which has a reference frequency, connected to a second input. In accordance with the invention, the signal source which has a reference frequency may include a frequency synthesizer as described above. Such a frequency converter may notably be used in a portable telephone.

Other characteristics and advantages of the invention pertain to the description that will follow, and have reference to the appended drawing Figures. This description is given in a purely illustrative and non-limitative capacity.

BRIEF DESCRIPTION OF THE DRAWING FIGURES

Figure 3:
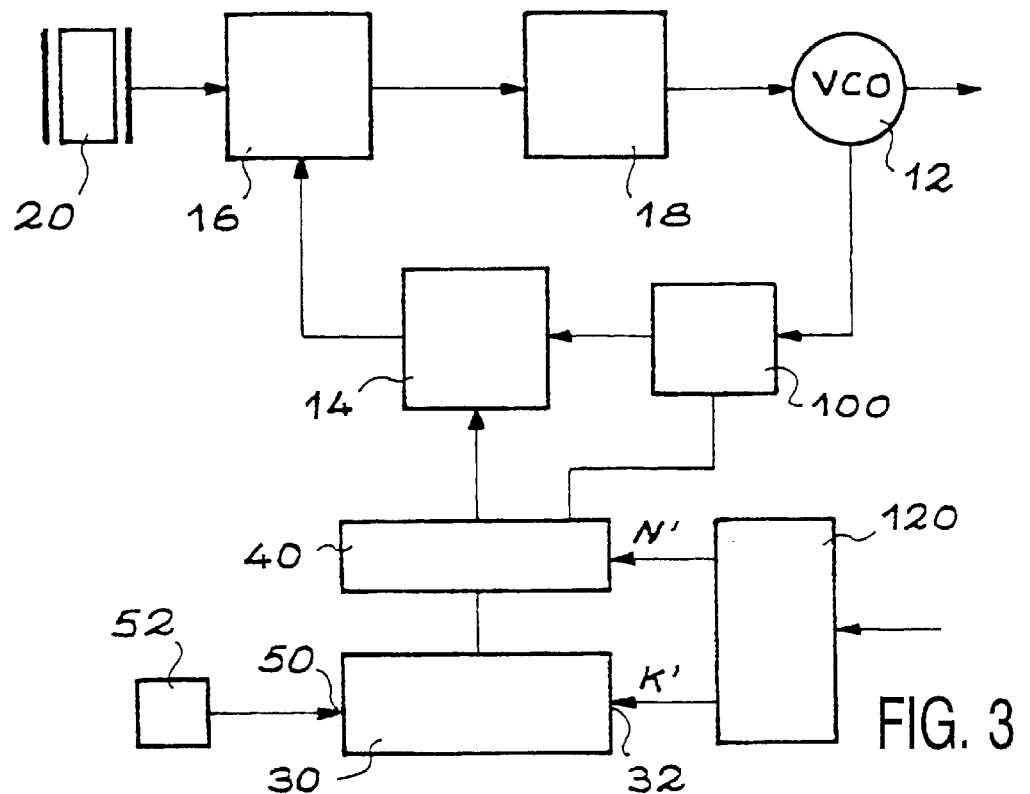
Figure 4:
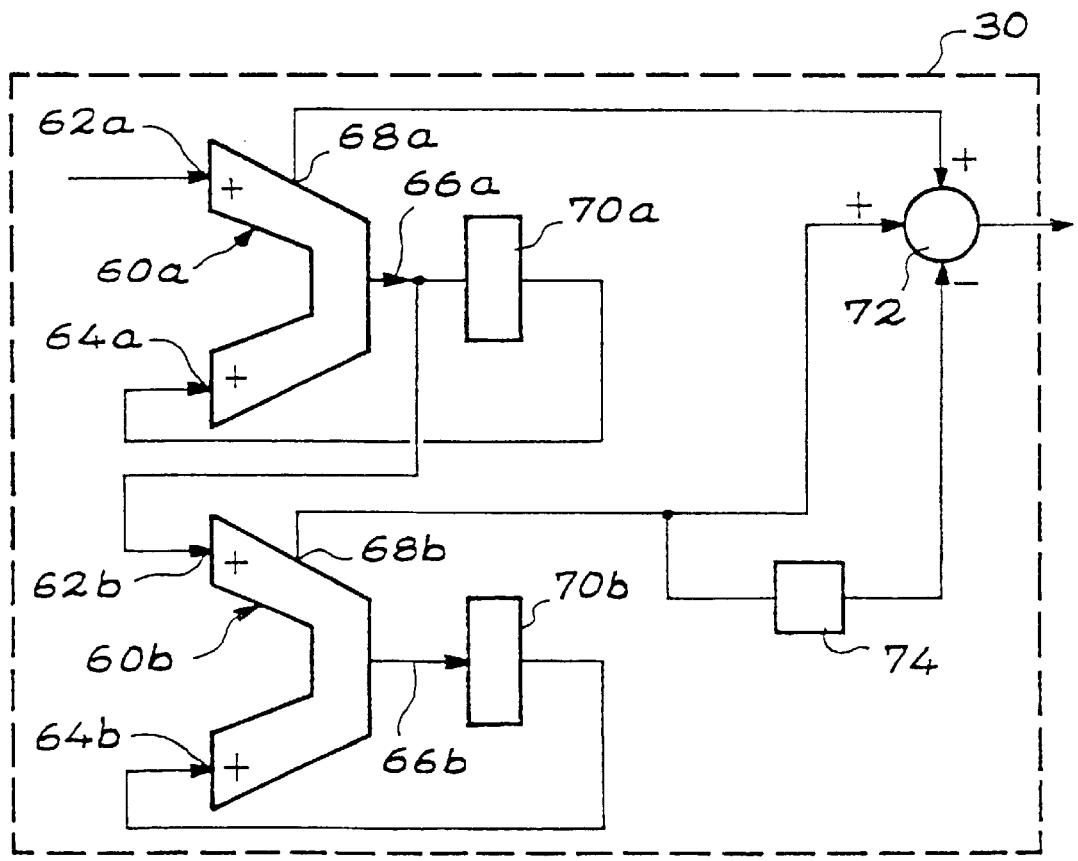
Figure 5:
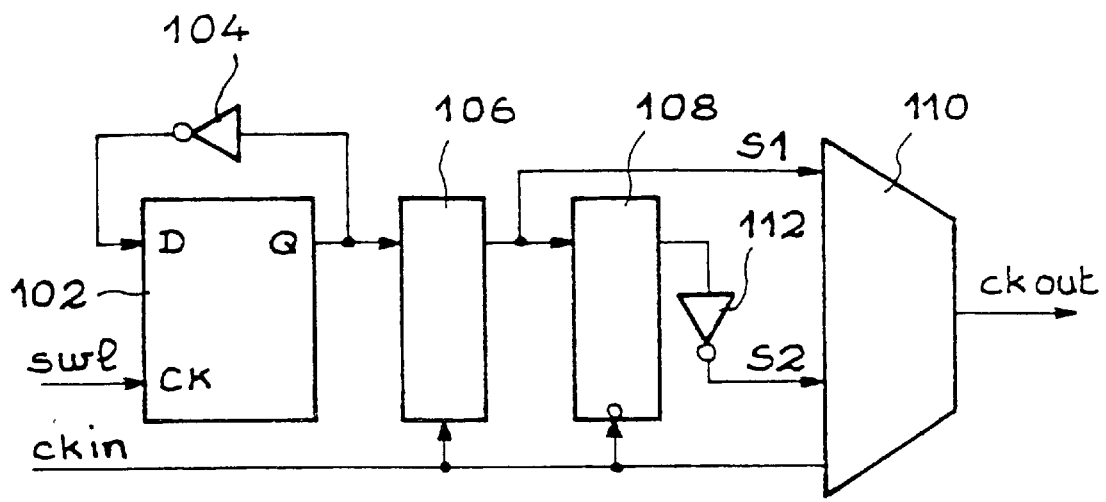
Figure 7:
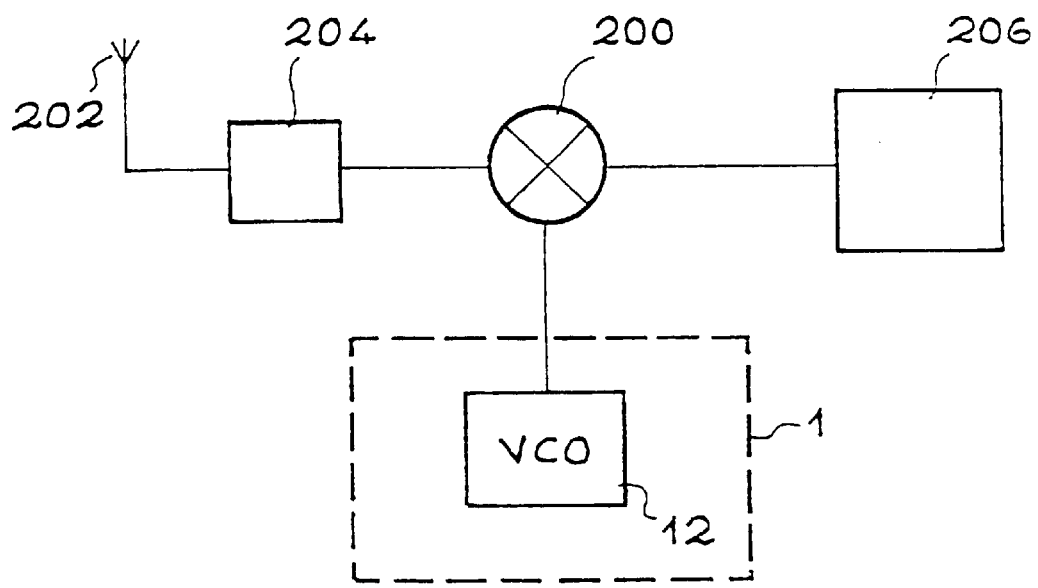
Figure 6:
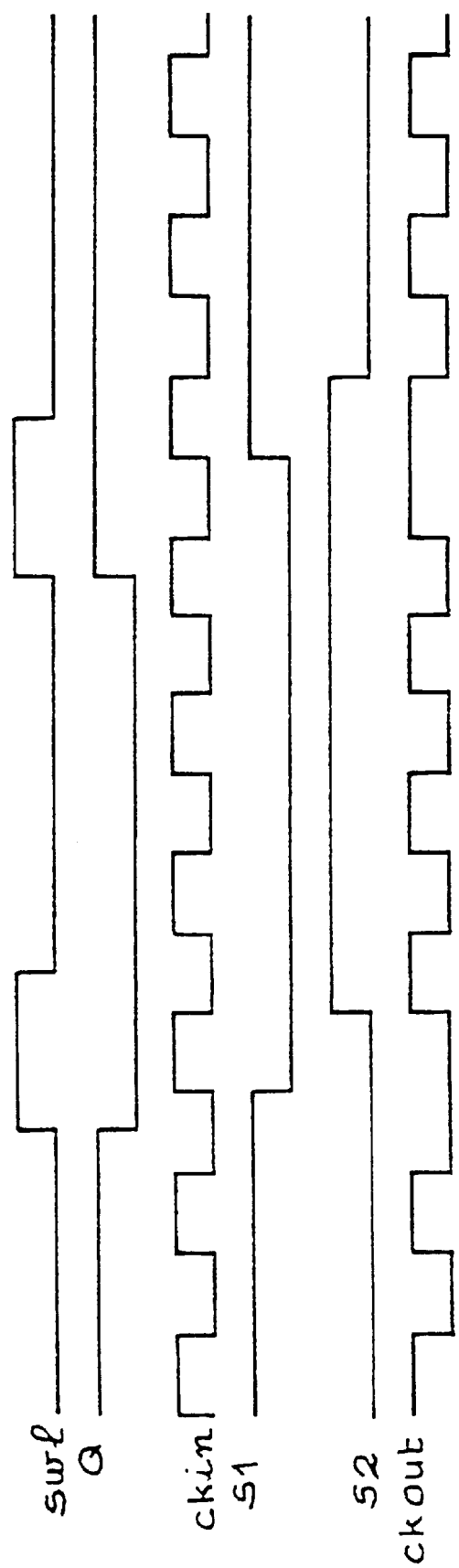

FIG. 1, already described, is a simplified basic circuit diagram of a known frequency synthesizer which has discrete frequency adjustment, FIG. 2, already described, is a simplified basic circuit diagram of a known frequency synthesizer which has continuous frequency adjustment, FIG. 3 is a simplified diagram of a frequency synthesizer according to the invention, FIG. 4 is a diagram illustrating a particular embodiment of a sigma-delta modulator for a frequency synthesizer as shown in FIG. 3, FIG. 5 is a diagrammatic representation of a frequency divider having a fixed fractional dividing ratio, used in the frequency synthesizer according to the invention, FIG. 6 is a timing diagram illustrating the operation of the frequency divider which has a fixed fractional dividing ratio of FIG. 5, FIG. 7 is a diagrammatic representation of a frequency converter which uses a frequency synthesizer according to the invention.

DETAILED DESCRIPTION OF EMBODIMENTS OF THE INVENTION

The elements of the Figures described hereinafter that are identical, similar or equivalent to corresponding elements of the preceding Figures, are referred to with like references and their detailed description is not again reverted to.

FIG. 3 shows a frequency synthesizer constructed around a phase-locked loop 10, which phase-locked loop 10 comprises a voltage-controlled oscillator 12, a frequency divider 14, a phase-frequency comparator 16 and a low-pass filter 18.

The frequency divider 14 is a programmable divider capable of dividing the frequency of a signal applied thereto by an integral number. It is associated to a dividing ratio calculator 40 intended to control a dividing ratio denoted N as a function of a signal delivered by a sigma-delta modulator 30.

More precisely, the calculator 40 controlled by the sigma-delta modulator is capable of controlling a switching of the dividing ratio between two or more integral consecutive values (or non-consecutive values) to obtain a mean dividing ratio with a fractional component. This ratio is referred to as "mean" ratio.

An additional frequency divider 100 is connected between the voltage-controlled oscillator 12 (VCO) and the frequency divider 14 having integral dividing ratios. The additional frequency divider 100 is a frequency divider which has a fractional, but fixed, dividing ratio. In the example described, the fixed dividing ratio is 1.5. This corresponds, while referring to the previous description, to a value $\epsilon=0,5$. Thus, the additional divider may either divide the frequency of the signal it receives by 1.5 (that is, $1+\epsilon$) when it is activated, or let the signal pass unchanged when it is not activated. In that case, the division is as it were a division by 1. It should be pointed out that the divider 100 may be replaced by a divider that has a different fractional ratio or by a series of two or more fractional dividers, connected after each other.

The fractional component k of the mean dividing ratio produced by the divider 14, which has integral dividing ratios, associated to the sigma-delta modulator, is linked with the adjusting instruction K by the following relation:

$$K = \frac{K}{2^L} \text{ or } K = 2^L * k$$

It will be recollected that L is the number of bits in which the instruction K is coded.

A circuit stage or a calculator (not shown) is provided to establish the integral component N and the fractional component k of the mean dividing ratio as a function of the desired oscillation frequency. Such a stage, which is also used in prior art devices, does not form part of the frequency synthesizer.

The values N and k (or K) are transmitted to a calculator 120 provided for verifying whether k is not too close to the value 0 or 1, that is to say, whether K is not too close to the value 0 or $2^L$. In the example shown is considered that k is not too close to 0 or 1 when the following relation is verified:

$0.25 \leq k \leq 0.75$, that is $\epsilon/2 \leq k \leq 1-\epsilon/2$ (with $\epsilon=0.,5$).

The calculator 120 is connected to the sigma-delta modulator 30 and to the dividing ratio calculator 40, already mentioned with respect to FIG. 3. The calculator 120 transmits thereto the new values N' and K' (or k).

TABLE I

| Value of k | Value of k' | Value of N' | Value of K' |
|---|---|---|---|
| $0 < k < \epsilon/2$ | $k' = k + \epsilon$ | $N' = N - \epsilon$ | $K' = 2L * k'$ |
| $\epsilon/2 \leq k \leq 1 - \epsilon/2$ | $k' = k$ | $N' = N - \epsilon$ | $K' = 2L * k'$ |
| $1 - \epsilon/2 < k < 1$ | $k' = k - \epsilon$ | $N' = N + \epsilon$ | $K' = 2L * k'$ |

It may be observed in the Table that N' is no longer of necessity an integral value, whereas N was. It must be pointed out in this respect that via a binary coding set it is possible to reduce the expression of N' to an integral digital value.

The dividing ratio calculator 40 is connected to the divider 14 which has integral dividing ratios in order to impose a succession of integral dividing ratios during the signal received by the sigma-delta converter in a manner described previously.

As the sigma-delta converter receives the new adjusting instruction, it permits to control a sequence of integral dividing ratios of the divider 14 in which no excessive repetition takes place of an (integral) dividing ratio.

The integral dividing ratios alternate, for example, between values P and P+1, or also, according to a variant, between values P−1, P, P+1 and P+2. In this respect Table II indicated in the rest of the text may be referred to.

The dividing ratios P−1, P, P+1 and P+2 are established in the calculator 40 as a function of the output of the sigma-delta modulator and as a function of the integral part of N', that is to say, as a function of N.

The dividing ratio calculator 40 also controls the activation or not of the divider 100 having the fractional dividing ratio. In a particular case where N is a digital value (coded, for example, with 6 bits), the least significant bit may be used for the activation (or not) of the frequency divider which has a fractional dividing ratio, whereas the other bits (the most significant bits) may be used for determining the value of P mentioned above.

The Table II hereinafter, which should be read in association with the Table II, indicates, depending on the value of k, the value of P as a function of N and the activation state of divider 100, which has a fractional dividing ratio. In Table II, P and N are integral values.

TABLE II

| Value of k | Value of N' | Value of P | Activation of divider 100 (i.e. divide-by-1 + $\epsilon$ divider) |
|---|---|---|---|
| $0 < k < \epsilon/2$ | $N - \epsilon$ | $P = N - 1$ | Yes (divide-by-1.5 divider) |
| $\epsilon/2 \leq k \leq 1 - \epsilon/2$ | $N$ | $P = N$ | No (divide-by-1 divider) |
| $1 - \epsilon/2 < k < 1$ | $N + \epsilon$ | $P = N$ | Yes (divide-by-1.5 divider) |

As regards the first line of the table, one may notice that it is impossible to "subtract" a quantity from N, but only to add a quantity thereto. Thus N−$\epsilon$ corresponds to (N−1)+(1−$\epsilon$). The quantity (N−1) is the new integral part. Furthermore, (1−$\epsilon$) is positive because $\epsilon$ is lower than 1.

Thanks to the activation of the divider 100 which has a fractional dividing ratio, and when the instructions of Table I are used, it is possible without changing the global dividing ratio obtained by the two dividers 14 and 100, that is to say, without changing the output frequency of the frequency synthesizer, to perfect the elimination of parasitic noise lines in its spectral response.

As is also shown in FIG. 3, the sigma-delta modulator 30 has a first input 32 connected to the calculator 120 for receiving the instruction denoted K' and a second input 50 connected to a flip-flop 52.

The flip-flop 52 is a flip-flop coded in one bit and locked onto the logic 1 value.

This logic 1 value is used either as a replacement of the least significant bit for the instruction K', or for forming a new adjusting instruction including the values of K' as more significant bits, and 1 as the least significant bit.

This permits, notably when k' is coded in a large number of bits, to dispose of an odd instruction without appreciably changing the finally obtained dividing ratio.

Thus, the parasitic lines resulting from the short repetition patterns of the dividing ratios are also moved further apart.

FIG. 4 described hereinafter indicates a possible realization of the sigma-delta modulator 30 of FIG. 3 and permits to better understand the coding in two bits of the output 32.

The sigma-delta modulator of FIG. 4 comprises two cascaded stages, constructed each around a word adder. A first word adder 60a has a first input 62a to which is applied the adjusting instruction K', which has been rendered odd.

The output 66a of the first word adder 60a is connected to its second input 64a via a clocked register 70a. The clocked register 70a may be controlled, for example, via the signal having the divided frequency delivered by the frequency divider. Thus, with each pulse, the sum previously obtained of the output 66a is sent back to the second input.

When the sum is lower than the capacity of the word adder, this word adder delivers on its overflow terminal 68a a retain value whose logic value is 0. On the other hand, when the sum is higher than the capacity of the logic value (retain), 1 is delivered. In that case, only the remainder of the addition that does not exceed the capacity of the word adder is delivered on the output 66a.

Finally, the overflow terminal 68a delivers a logic value coded in a single bit, which may have the state 0 or 1.

The output 66a is also connected to the first input 62b of the word adder 60b of the second stage. Similarly, the output 66b of this adder is connected to its second input 64b via a clocked register 70b.

The word adder 60b of the second stage also has an overflow terminal 68b whose logic output coded in two bits may have the states 0 and 1.

An adder/subtracter 72 having three inputs receives on the positive input the logic values which are available on the overflow terminals of the two word adders 60a, 60b. It also receives on its negative input the carry of the overflow terminal of the word adder 60b of the second stage, via a delay flip-flop 74.

The output 76 of the adder/subtracter is directed towards the calculator 40 having the dividing ratio mentioned with reference to FIG. 3.

The Table III hereinafter gives by way of indication the value (decimal) of the output of the adder/subtracter 72 as a function of the values of the inputs, and indicates the corresponding dividing ratio imposed on the divider 14.

TABLE III

| Adder 60a (logic) | Adder 60b (logic) | Delay flip-flop 74 (logic) | Output 72 | Division by |
|---|---|---|---|---|
| 0 | 0 | 1 | −1 | p − 1 |
| 0 | 1 | 0 | 1 | p |
| 1 | 0 | 1 | 0 | p + 1 |
| 1 | 1 | 0 | 2 | p + 2 |

The successive division by the various dividing ratios above, whose sequence is dictated by the adjusting instruction K', permits to obtain a fractional mean dividing ratio that is between P and P+1

FIG. 5 proposes a particular possibility of realization of a divider which has a fractional factor. In this case a divide-by-1.5 divider is concerned, as referred to previously.

The divider of FIG. 5 comprises a flip-flop D102 of known type with a D input and a Q output. A second input receives a synchronization signal denoted sw1. The Q output of the flip-flop 102 is connected, on the one hand, to the D input via an inverter 104, and on the other hand, to the input of a first latch gate 106 (locking).

The output of the first latch gate 106 is connected, on the one hand, to the input of a second latch gate 108 and, on the other hand, to a first input S1 of a multiplexer 110. The output of the second latch gate 108 is connected to a second input S2 of the multiplexer 110 via an inverter 112. The latch gates 106 and 108, similarly to the multiplexer 110, are timed with an input signal ckin which is in this case the signal to be divided.

The divided signal, denoted ckout, available on the output 114 of the multiplexer 110, corresponds to the input signal in which certain transition edges between a high state and a low state are eliminated.

The operation of the divider of FIG. 5 is described by the timing diagram of FIG. 6 which, on the same time-dependent basis, indicates the state of the inputs and outputs of the components of the divider of FIG. 5. The timing diagram indicates, more particularly, the synchronization signal sw1, the output signal Q of the flip-flop D102, the input signal ckin to be divided and the signal available on the inputs S1 and S2 of the multiplexer and the divided output signal ckout. By comparing the signals ckin and ckout, one will notice that transition edges are eliminated step by step, notably when the inputs S1 and S2 are in the same logic state. The elimination of these edges corresponds to the division of the frequency.

FIG. 7 shows an application of a frequency synthesizer in accordance with the invention to the realization of a frequency converter and, more precisely, to a frequency converter in a signal transceiver.

The converter comprises a mixer to which is connected, on the one hand, a source of a signal to be converted, for example, an antenna 202 associated to a filter 204, and, on the other hand, a processing unit 206. The processing unit 206 receives the signal whose frequency is converted. This is, for example, a processing unit of a portable telephone.

The mixer 200 also receives a reference frequency signal of a second signal source, which signal in the example described comes from a VCO oscillator 12of a frequency synthesizer 1 in accordance with the invention.

Cited documents (1) EP-B-0 661 816
(2) EP-A-0 563 400
(3) "Fractional-N P11 using delta-sigma modulation" by Thomas Stichelbout Aalborg University, Aug. 5, 1997, pp. 1 to 21.

What is claimed is:

1. A frequency synthesizer comprising a phase-locked loop (10) and comprising:

a frequency divider (14) having integral dividing ratios, connected between a voltage-controlled oscillator (12) and a phase/frequency comparator (16), a sigma-delta modulator (30) connected to the frequency divider (14) for switching the dividing ratio of the frequency divider between a series of at least two integral values, so as to obtain a resulting mean dividing ratio having a fractional component, the modulator having at least an input (32) suitable for receiving an adjusting instruction of the fractional component, and at least a frequency divider (100) having a fixed fractional dividing ratio, connected between the voltage-controlled oscillator (12) and the frequency divider having integral dividing ratios (14), and means for activating the divider (100) having a fractional dividing ratio when the fractional component (k) of the mean dividing ratio is contained in at least a given value range, and for modifying the adjusting instruction of the fractional component of the sigma-delta modulator.

2. A synthesizer as claimed in claim 1, in which the fixed fractional dividing ratio is 1+.epsilon. and in which the given value range of the fractional component (k) comprises the values k so that: 0<k<.epsilon./2 and 1-.epsilon./2<k<1 where .epsilon. is a value strictly comprised between 0 and 1.

3. A synthesizer as claimed in claim 2, in which .epsilon.= 0.5.

4. A synthesizer as claimed in claim 1, in which the means for activating the fractional divider and for modifying the adjusting instruction of the fractional component of the sigma-delta modulator comprise a dividing ratio calculator (40) connected to the frequency divider having a fractional dividing ratio (100) for activating or deactivating, respectively, said divider.

5. A frequency synthesizer as claimed in claim 1, in which the sigma-delta modulator (30) is a two-stage modulator.

6. A synthesizer as claimed in claim 1, further including means (52) for setting the value of the least significant bit of the adjusting instruction applied to the sigma-delta modulator to 1.

7. A method of synthesizing frequencies by means of a phase-locked synthesizer, comprising:

a frequency divider (14) having integral dividing ratios, connected between a voltage-controlled VCO oscillator (12) and a phase frequency comparator PFD (16), a sigma-delta modulator (30) connected to the frequency divider for switching the dividing ratio of the frequency divider between a series of at least two integral values, so as to obtain a resulting mean dividing ratio having a fractional component, the modulator having an input for an adjusting instruction of the fractional component, and at least a frequency divider (100) having a fixed fractional dividing ratio, connected between the voltage-controlled VCO oscillator (12) and the frequency divider (14) having an integral dividing ratio, according to which said frequency divider (100) having a fractional dividing ratio is activated when the fractional component (k) of the dividing ratio is contained in at least a given value range and in corresponding manner the adjusting instruction of the fractional component of the sigma-delta modulator is modified to keep the mean dividing ratio unchanged.

8. A method as claimed in claim 7, in which said frequency divider having a fractional dividing ratio is activated when the fractional component k of the dividing ratio is such that 0<k<.epsilon./2 or that 1-.epsilon./2<k<1, and said frequency divider having a fractional dividing ratio is deactivated when the fractional component k of the dividing ratio is such that .epsilon./2.1toreq.k.1toreq.1-.epsilon./2.

9. A method as claimed in claim 8, in which a new adjusting instruction k' is applied to the sigma-delta modulator (30) with k'=k+.epsilon. when 0<k<.epsilon./2 and k'=k-.epsilon. when 1-.epsilon./2<k<1.

10. A frequency converter comprising a mixer (200) which has a first input connected to a first signal source (202, 204) delivering a signal with a frequency to be converted, and comprising a second signal source (1) with a reference frequency, the second source being connected to a second input of the mixer, characterized in that the second signal source (1) with a reference frequency comprises a frequency synthesizer (12) as claimed in claim 1.

11. The use of a frequency converter as claimed in claim 10 in a portable telephone.

* * * * *